United States Patent
Weiss

(10) Patent No.: US 9,991,915 B2
(45) Date of Patent: Jun. 5, 2018

(54) PREDISTORTION SYSTEM AND METHOD USING A PREDISTORTION FUNCTION

(71) Applicant: Rohde & Schwarz GmbH & Co. KG, Munich (DE)

(72) Inventor: Martin Weiss, Holzkirchen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 0 days. days.

(21) Appl. No.: 15/604,233

(22) Filed: May 24, 2017

(65) Prior Publication Data
US 2018/0102799 A1 Apr. 12, 2018

Related U.S. Application Data

(60) Provisional application No. 62/453,828, filed on Feb. 2, 2017.

(30) Foreign Application Priority Data

Oct. 7, 2016 (EP) .................................... 16192718

(51) Int. Cl.
*H04B 1/04* (2006.01)

(52) U.S. Cl.
CPC ... *H04B 1/0475* (2013.01); *H04B 2001/0425* (2013.01)

(58) Field of Classification Search
USPC ........................................................ 330/149
See application file for complete search history.

(56) References Cited

U.S. PATENT DOCUMENTS

| 9,088,248 B2* | 7/2015 | Zohny ..................... H03F 3/193 |
| 2008/0211576 A1* | 9/2008 | Moffatt ................. H03F 1/3247 |
| | | 330/149 |
| 2008/0285640 A1* | 11/2008 | McCallister ...... H04L 25/03044 |
| | | 375/233 |
| 2016/0191020 A1 | 6/2016 | Velazquez |

FOREIGN PATENT DOCUMENTS

WO 9905784 A1 2/1999

* cited by examiner

*Primary Examiner* — Eva Puente
(74) *Attorney, Agent, or Firm* — Ditthavong & Steiner, P.C.

(57) ABSTRACT

A predistortion system for correcting a distortion of a distorting component is provided. It comprises a signal generator, adapted to generate a first signal based upon a reference signal, the distorting component, adapted to generate a second signal, based upon the first signal, and an iterative predistortion device, adapted to determine a compensated signal based upon the second signal and the reference signal. The signal generator is adapted to use the compensated signal as reference signal in further iterations after a first iteration. The predistortion system moreover comprises a predistortion calculation device, adapted to determine a predistortion function based upon the reference signal and the first signal. The signal generator is then adapted to generate the first signal based upon the predistortion function for further reference signals.

15 Claims, 6 Drawing Sheets

PREDISTORTION SYSTEM AND METHOD USING A PREDISTORTION FUNCTION

PRIORITY

This application claims priority of the European patent application EP 16 192 718.1 filed on Oct. 7, 2016, and U.S. Provisional Application No. 62/453,828, filed on Feb. 2, 2017, the entire contents of which are incorporated by reference herein.

FIELD OF THE INVENTION

The invention relates to a predistortion system and a predistortion method for optimizing the performance of distorting components.

BACKGROUND OF THE INVENTION

Typically, with special respect to communication applications, a linear behavior of the employed components, especially of amplifiers, is not only desired but even necessary in order to ensure the avoidance of nonlinear distortion, and thus the prevention of an undesirable interference spectrum. In this context, due to the fact that in practice, there are no ideal components having a completely linear characteristic available, the performance of distorting components has to be optimized especially regarding linearity.

WO 99/05784 A1 discloses a correcting device for automatically correcting a high frequency power amplifier with the aid of predistortion. The correcting device has a mechanism for generating a reference carrier from a measured input signal of the high frequency power amplifier, and a synchronous demodulator for generating an input envelope curve from a reference signal. Nevertheless, the aforementioned document does not consider providing the reference signal not only for the purpose of generating a desired signal but also for the purpose of predistortion. As a consequence of the lack of providing the reference signal also for predistortion, the total noise is the sum of the noise floor of the system and the respective noise components of each of the elements involved in predistortion, which leads to a non-optimal, respectively faulty, predistortion, and thus to a not perfectly optimized performance of the amplifier with special respect to linearity. Another non-linear method of compensation is known from US 2016/0191020 A1.

The European patent application EP 16 192 718.1, which is incorporated by reference herein, shows a predistortion system and method, which allow for a significantly higher performance of the predistortion. The system and method shown there though are not optimal for some applications, since it is not possible to judge if the predistortion determined iteratively is suitable for a different waveform. Also, it is not possible to assure that the resulting predistortion filtering meets bandwidth conditions. Moreover, it is difficult to foresee the performance of the predistortion device trained with baseline signals, when using real-world signals.

Accordingly, there is a need to provide a predistortion system and a predistortion method for optimizing the performance of distorting components, which especially assure meeting bandwidth requirements and which function reliably with real-world signals.

SUMMARY OF THE INVENTION

According to a first aspect of the invention, a predistortion system for correcting a distortion of a distorting component is provided. The predistortion system comprises a signal generator, adapted to generate a first signal based upon a reference signal, the distorting component, adapted to generate a second signal, based upon the first signal, and an iterative predistortion device, adapted to determine a compensated signal based upon the second signal and the reference signal. The signal generator is adapted to use the compensated signal as reference signal in further iterations after a first iteration. The predistortion system moreover comprises a predistortion calculation device, adapted to determine a predistortion function based upon the reference signal and the first signal. The signal generator is then adapted to generate the first signal based upon the predistortion function for further reference signals. It is thereby assured that for further reference signals, a high quality predistortion is available from the beginning on.

According to a first implementation form of the first aspect, the iterative predistortion device comprises an analyzing device, adapted to perform a frequency and/or time domain analysis of the second signal, resulting in a third signal, and a predistortion device, adapted to generate the compensated signal based upon the reference signal and the third signal. The predistortion device is adapted to determine the compensated signal iteratively. This allows for a simple and quick determination of the compensated signal.

According to a second implementation form of the first aspect, the predistortion calculation device is adapted to determine the predistortion function as a transformation function for transforming the reference signal into the first signal. This ensures a not to complex determining of the predistortion function.

According to a further implementation form of the first aspect, the predistortion calculation device is adapted to determine the transformation as a polynomial transformation function or a memory polynomial transformation function or a volterra transformation function. This allows for a high accuracy of determining the transformation.

According to a further implementation form of the first aspect, the predistortion calculation device is adapted to determine optimal parameters of the transformation function, used. This ensures an especially high quality of determining the transformation.

According to a different further implementation form of the first aspect, the predistortion calculation device is adapted to use a user input transformation function and/or transformation function parameters for determining the predistortion function. Thereby it is especially simple to adapt the system to a signal by an expert user.

According to a further implementation form of the first aspect, the distorting component is an amplifier. It is thereby possible to remove negative effects of non-linear distortions generated by amplifiers.

According to a further implementation form of the first aspect, the predistortion calculation device is adapted to determine, which coefficients of a predistortion filter contribute significantly to generating an ideally predistorted first signal and to disregard coefficients not significantly contributing to generating an ideally predistorted first signal. The computational complexity necessary within the signal generator can thereby significantly be reduced.

According to a second aspect of the invention, a predistortion method for correcting a distortion of a distorting component is provided. The method comprises generating a first signal based upon a reference signal by a signal generator, generating a second signal from the first signal, by a distorting component, determining a compensated signal based upon the second signal and the reference signal, by an iterative predistortion device, using the compensated signal as a reference signal in further iterations after a first iteration, by the signal generator, determining a predistortion function based upon the reference signal and the first signal, by a predistortion calculation device, and generating the first signal based upon the predistortion function for further reference signals, by the signal generator. It is thereby assured that for further reference signals, a high quality predistortion is available from the beginning on.

BRIEF DESCRIPTION OF THE DRAWINGS

Exemplary embodiments of the invention are now further explained with respect to the drawings by way of example only, and not for limitation. In the drawings.

First, some general aspects of the invention are explained. After this, a number of embodiments of the invention are described.

Generally, for predistortion, especially digital predistortion, a model-based characterization of the respective distorting component can be used. Digital predistortion based solely on model-based characterization of the distorting component does not achieve a maximum transmission quality.

In accordance with the present invention, due to the iterative predistortion, respectively iterative digital predistortion, a best optimization of the performance of a distorting component is achieved for any desired waveform such as Long Term Evolution (LTE), Global System for Mobile communication (GSM), radar signals, etc.

Said performance optimization with the aid of the present invention may exemplarily relate to maximum linearization, maximization of Root Mean Square (RMS), minimization of the Adjacent Channel Power (ACP), respectively ACP leakage rate, or minimization of the Error Vector Magnitude (EVM) with respect to a reference signal.

In addition to this, it is to be pointed out that according to the present invention, the optimization of the performance of the distorting component is solely restricted by the noise floor of the predistortion system.

Especially through using the inventive predistortion calculator, it is possible to determine a predistortion function which allows for performing a near-ideal predistortion even for new signals.

DETAILED DESCRIPTION OF PREFERRED EMBODIMENTS

Figure 1:
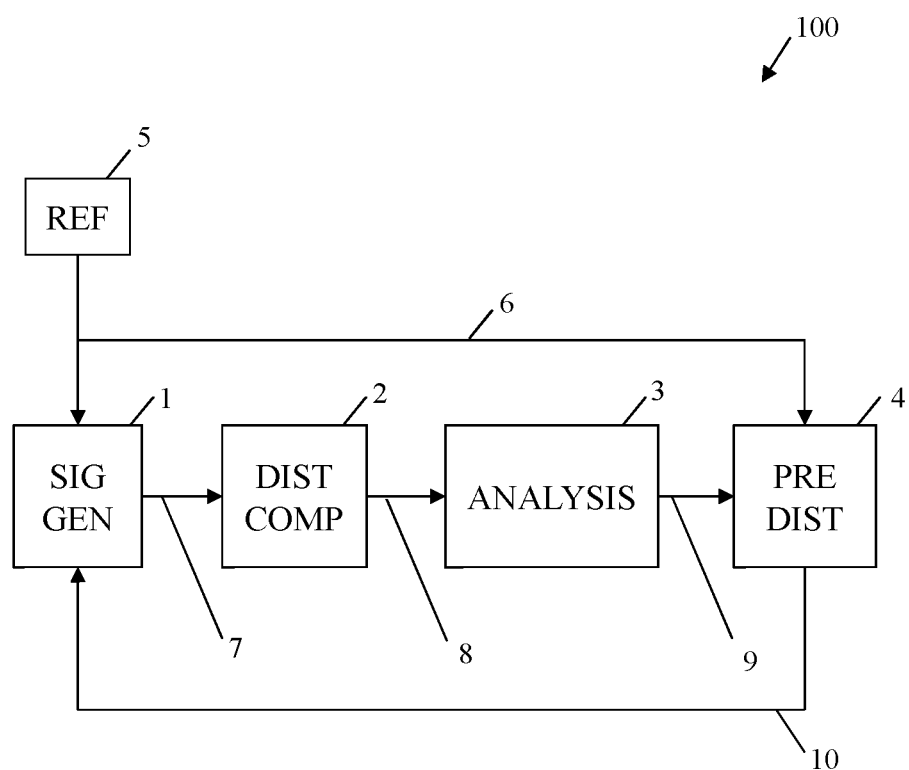
FIG. 1 shows a block diagram of an exemplary predistortion system.

Now, from FIG. 1, an exemplary predistortion system 100 can be seen. A signal generator 1 generates a first signal 7 according to a reference signal 6, which is provided by reference signal source 5.

In the exemplary case according to FIG. 1, the reference signal source 5 is an external reference signal source. Alternatively, the reference signal source 5 may advantageously be part of the signal generator 1. Further advantageously, the reference signal source 5 may be implemented in hardware or software or a combination thereof. In addition to this, the reference signal 6 may be a fixed signal or a user-defined signal of any desired waveform.

Then, the first signal 7 is passed to a distorting component 2, which distorts the first signal 7 and outputs a corresponding second signal 8. Advantageously, the distorting component 2 is an amplifier.

Furthermore, an analyzing device 3 for frequency and/or time domain analysis, preferably a spectrum analyzer or an oscilloscope or at least a combination of a downconverter and a digitizer, analyses the second signal 8 and passes a respective third signal 9 to a predistortion device 4.

For the predistortion device 4, not only the third signal 9 is provided, but also the reference signal 6. On the basis of these signals 6 and 9, the predistortion device 4 generates a compensated signal 10 which is fed back to the signal generator 1.

In addition to this, the compensated signal 10 correlates with the reference signal 6 in an iterative manner. More precisely, the compensated signal is modified on the basis of the deviation of the third signal 9 from the reference signal 6. Furthermore, at each iteration step, the predistortion device 4 modifies the compensated signal 10 in a manner that each sample of the compensated signal 10 is replaced by the product of the respective sample of the previous compensated signal, in other words, the compensated signal 10 of the previous iteration step, and the quotient of the corresponding sample of the reference signal 6 and the respective sample of the third signal 9.

Moreover, for initializing the iteration, the compensated signal 10 is set to the reference signal 6. Alternatively, the previous compensated signal, in other words, the compensated signal 10 of the previous iteration step, is set to the reference signal 6. On the other hand, for terminating the iteration, a maximum number of iterations is predefined, which advantageously leads to convergence. Alternatively, the value of the respective error vector magnitude can be used for terminating the iteration. In this case, the iteration will terminate if the value of the error vector magnitude is less than a corresponding threshold value.

Furthermore, it should be mentioned that at least one of the above-mentioned signals, namely the reference signal 6, the first signal 7, the second signal 8, the third signal 9, and the compensated signal 10 is a quadrature signal.

The system shown in FIG. 1 though has the disadvantage that determining the predistortion iteratively requires a certain amount of time, in which the output signal is not perfectly predistorted. Moreover, it cannot be guaranteed that the resulting predistortion meets bandwidth constraints of the available communications channel.

Figure 2:
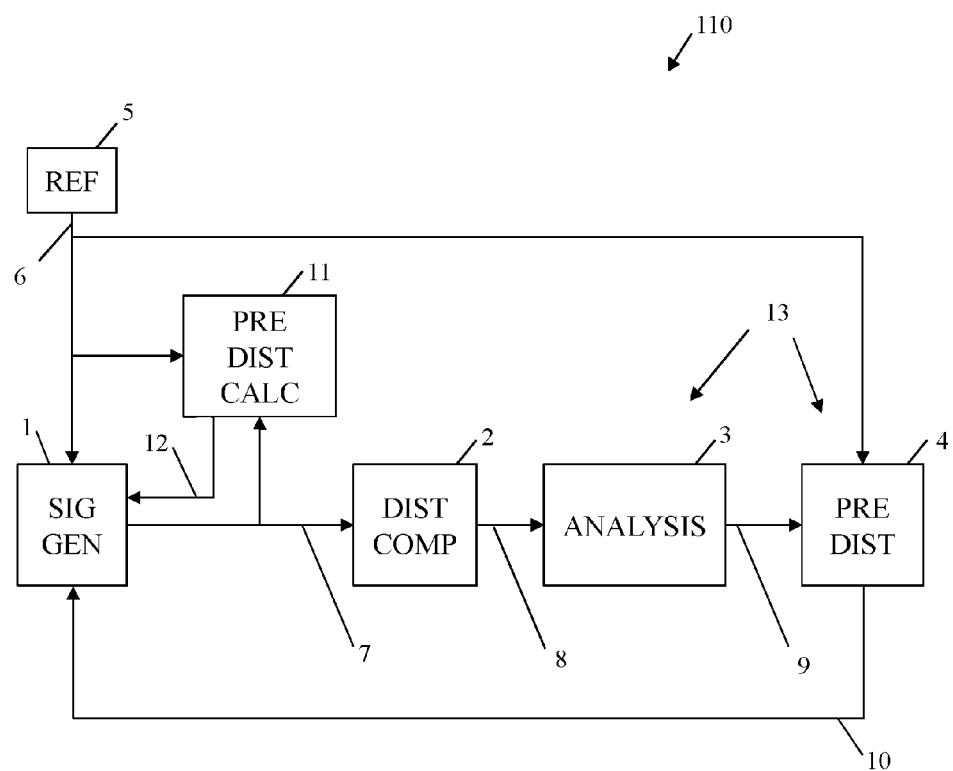
FIG. 2 shows a block diagram of a first embodiment of the inventive predistortion system.

These disadvantages are overcome by the inventive predistortion system 110, shown in FIG. 2. The predistortion system 110 additionally comprises a predistortion calculation device 11, which is supplied by the reference signal source 5 with the reference signal 6. Additionally, it is supplied by the signal generator 1, with the first signal 7.

Moreover, here the analyzing device 3 and the predistortion device 4 are jointly referenced as iterative predistortion device 13.

Figure 3:
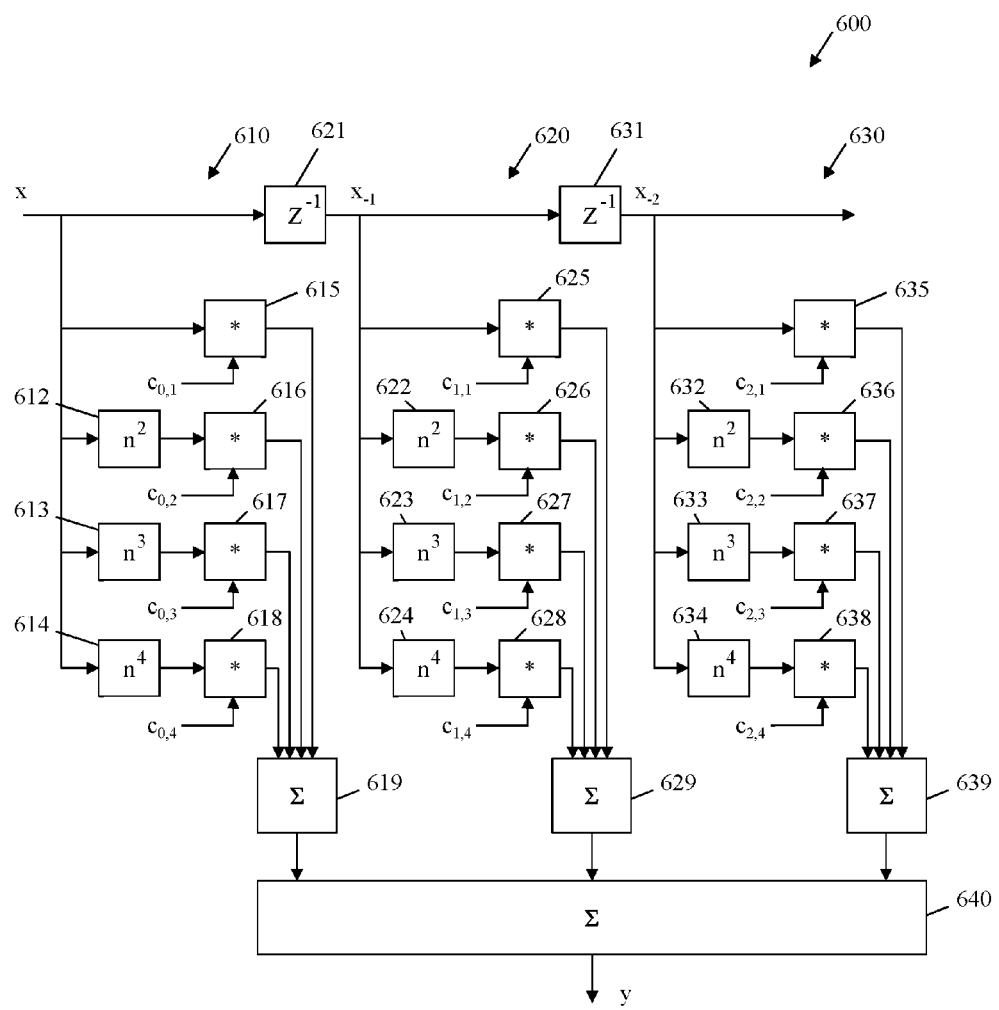
FIG. 3 shows an exemplary memory polynomial filter, as used in a second embodiment of the inventive predistortion system.

After a number of iterations performed as described along FIG. 1, the first signal 7 is suitably adapted to the distortion generated by the distorting component 2 and compensates this distortion by means of predistortion. Therefore, the reference signal 6 and the first signal 7 contain all information for determining a predistortion function by the predistortion calculating device 11 after a number of iterations. The predistortion calculation device 11 therefore determines a predistortion function based upon the reference signal 6 and the first signal 7. Especially, the predistortion function is determined as a transformation for transforming the reference signal 6 into the first signal 7. This transformation may be a polynomial transformation function, especially a memory polynomial transformation function or a volterra transformation function. An exemplary transformation filter using a memory polynomial transformation function is shown in FIG. 3.

Also, the predistortion calculation device 11 determines the parameters of the respective transformation function in order to optimally match the transformation from the reference signal 6 to the first signal 7. While doing so, the predistortion calculation device 11 additionally determines which coefficients of a respective transformation filter are relevant for the transformation and which coefficients do not significantly affect the transformation. Only the most relevant coefficients are considered, while the remaining coefficients are disregarded. By this measure, the computational complexity necessary for transforming the reference signal 6 into the first signal 7 is significantly reduced.

By varying the memory and the polynomial order, in case of a memory polynomial function, is can be estimated, how complex it will be to implement the predistortion. If for example a reduction of the number of taps from 11 to three does not change the performance of the predistortion, a memory of three taps is sufficient. This is very advantageous, if the predistortion is implemented as an FPGA.

Moreover, signal spikes outside of the bandwidth, occurring in the iterative approach, can be prevented or at least mitigated by determining and using the transformation function, since the choice of transformation function and parameters limits the bandwidth by principle.

Advantageously, the predistortion calculation device 11 uses a least-square-approach for determining the transformation function.

The resulting predistortion function is handed to the signal generator 1, which performs the transformation of the reference signal 1 to the first signal 7 using the transformation function when a similar waveform appears as reference signal 6 later on. Therefore, it is no longer necessary to perform the iterative approach, previously described, if an already known waveform is used as reference signal 6.

In FIG. 3, a memory polynomial filter 600, for implementing a memory polynomial transformation function is shown. The filter 600 comprises a first tap 610, a second tap 620 and a third tap 630.

The first tap 610 comprises a first branch with a first multiplier 615. Moreover, it comprises a second branch with a squaring device 612 and a second multiplier 616. Moreover, the first tap 610 comprises a third path with a cubing device 613 and a third multiplier 617. Furthermore, the first tap 610 comprises a fourth path with a double squaring device 614 and a fourth multiplier 618.

An input signal x, which corresponds to a current value of the reference signal 6 is input into the first tap 610. It is supplied to the first multiplier 615, which multiplies it by a first coefficient $c_{0,1}$. It is moreover supplied to the squaring device 612, which squares the signal and provides a resulting squared signal to the second multiplier 616, which multiplies it by a coefficient $c_{0,2}$. Moreover, the signal x is supplied to the cubing device 613, which cubes the signal and provides a resulting cubed signal to the third multiplier 617, which multiplies it with a coefficient $c_{0,3}$. Moreover, the signal x is supplied to the double squaring device 614, which performs an $n^4$ operation, which is identical to performing two squaring operations and hands the resulting signal to the fourth multiplier 618, which in turn multiplies it with a coefficient $c_{0,4}$.

The multiplier 615-618 are connected to an adder 619, which is part of the first tap 610. The adder 619 sums up the output signals of the multiplier 615-618.

The second tap 620 comprises a first time delayer 621, which performs a time delay of the input signal x, resulting in an input signal $x_{-1}$, wherein the signal $x_{-1}$ is the input signal x delayed by one sample. The second tap 620 moreover comprises a first path connected to the input signal $x_{-1}$, comprising a first multiplier 625. Moreover, it comprises a second path, comprising a squaring device 622, connected to a second multiplier 626. Furthermore it comprises a third path, comprising a cubing device 623, connected to a third multiplier 627. Furthermore, the second tap 620 comprises a fourth path, comprising a double squaring device 624, connected to a fourth multiplier 628. The outputs of the multiplier 625-628 are connected to an adder 629.

The delayed input signal $x_{-1}$ is supplied to the first multiplier 625, which multiplies it by a coefficient $c_{1,1}$, and hands the output signal to the adder 629. The squaring device 622 squares the input signal $x_{-1}$ and hands the resulting squared signal to the second multiplier 626, which multiplies it by a coefficient $c_{1,2}$, and hands the resulting signal to the adder 629. The input signal $x_{-1}$ is cubed by the cubing device 623, which passes the resulting cubed signal to the third multiplier 627, which multiplies it by a coefficient $c_{1,3}$ and hands the resulting signal to the adder 629. The input signal $x_{-1}$ is moreover squared two times by the double squarer 624, therefore performing an $n^4$ operation. The resulting signal is handed to the fourth multiplier 628, which multiplies it by a coefficient $c_{1,4}$ and hands the resulting signal to the adder 629. The adder 629 sums up all of its input signals.

The third tap 630 comprises a second time delayer 631, which performs another time delay of one sample, resulting in an input signal $x_{-2}$. This input signal $x_{-2}$ is provided to four paths. The first path comprises a first multiplier 625, the second path comprises a squaring device 632 connected to a second multiplier 636, the third path comprises a cubing device 633, connected to a third multiplier 637, and the fourth path comprises a double squaring device 634 connected to a fourth multiplier 638. The multipliers 635-638 are connected to an adder 639.

The first multiplier 635 multiplies the input signal $x_{-2}$ by a coefficient $c_{2,1}$ and provides the result to the adder 639. The squaring device 632 squares the input signal $x_{-2}$ and hands the result to the second multiplier 636, which multiplies it by coefficient $c_{2,2}$ and hands the result to the adder 639. The cubing device 633 cubes the input signal $x_{-2}$ and hands the result to the third multiplier 637, which multiplies the resulting signal with a coefficient $c_{2,3}$ and hands the result to the adder 639. The double squaring device 634 performs an $n^4$ operation on the input signal $x_{-2}$ and hands the result to the fourth multiplier 638, which multiplies it by a coefficient $c_{2,4}$ and hands the result to the adder 639.

The filter 600 moreover comprises an adder 640, which adds up the results of the adders 619, 629 and 639. The output of the adder 640 is the output signal y, which corresponds to the predistorted signal 7, provided to the distorting component 2.

The values of the coefficients $c_{0,1}$-$c_{2,4}$ define the filter function of the memory polynomial filter 600. The exemplary filter 600 shown here is to be understood as an example only. The number of taps and the number of coefficients employed in each tap shown here is not to be seen as limiting. Dependent upon the complexity of the distortion generated by the distorting device 2, a more or less complex transformation function is necessary, to ideally predistort the reference signal 6.

Figure 4:
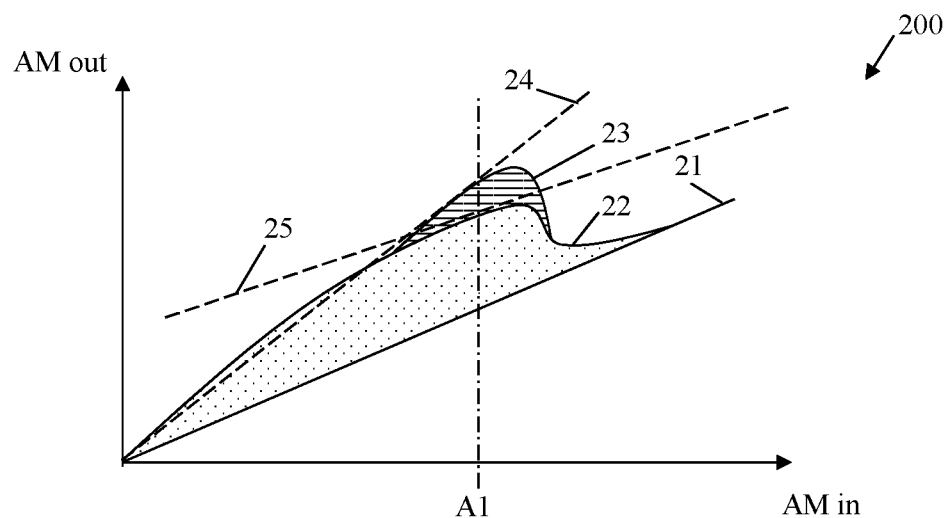
FIG. 4 shows an exemplary input-output diagram of an amplifier with respect to amplitude.

Now, with respect to FIG. 4, an exemplary input-output diagram 200 of an amplifier regarding amplitude is shown. In this exemplary case, straight line 21 illustrates linear operation of the amplifier, for instance, class-A operation.

Furthermore, whereas curve 22 illustrates nonlinear operation of the amplifier, for example, class-AB operation, without predistortion, curve 23 exemplifies the same use case but with predistortion.

From FIG. 4 with special respect to curves 22 and 23, it becomes immediately clear that predistortion, especially iterative digital predistortion, advantageously leads to a large linear range of the amplifier.

In addition to this, it should be mentioned that for a predefined input amplitude value A1, the slope illustrated with the aid of straight line 24 in the respective point of curve 23 with predistortion is advantageously higher than the slope visualized by straight line 25 in the corresponding point of curve 22 without predistortion.

Figure 5:
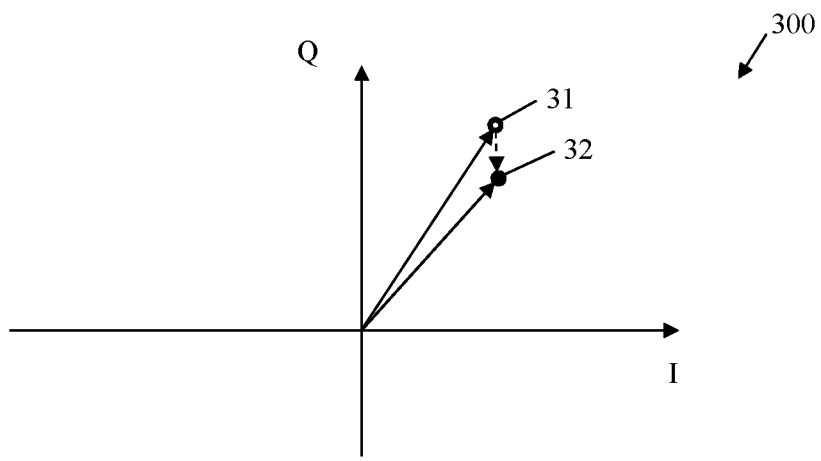
FIG. 5 shows an exemplary I-Q constellation diagram with respect to a symbol being relocated with the aid of predistortion.

Moreover, with respect to FIG. 5, due to predistortion, especially due to iterative digital predistortion, constellation point 31 of I-Q constellation diagram 300 is relocated in order to be placed at the ideal point 32 which corresponds to the desired symbol. For the purpose of relocating according to the example of FIG. 3, amplitude and phase are adjusted accordingly. Alternatively, solely amplitude or phase may be changed.

Figure 6:
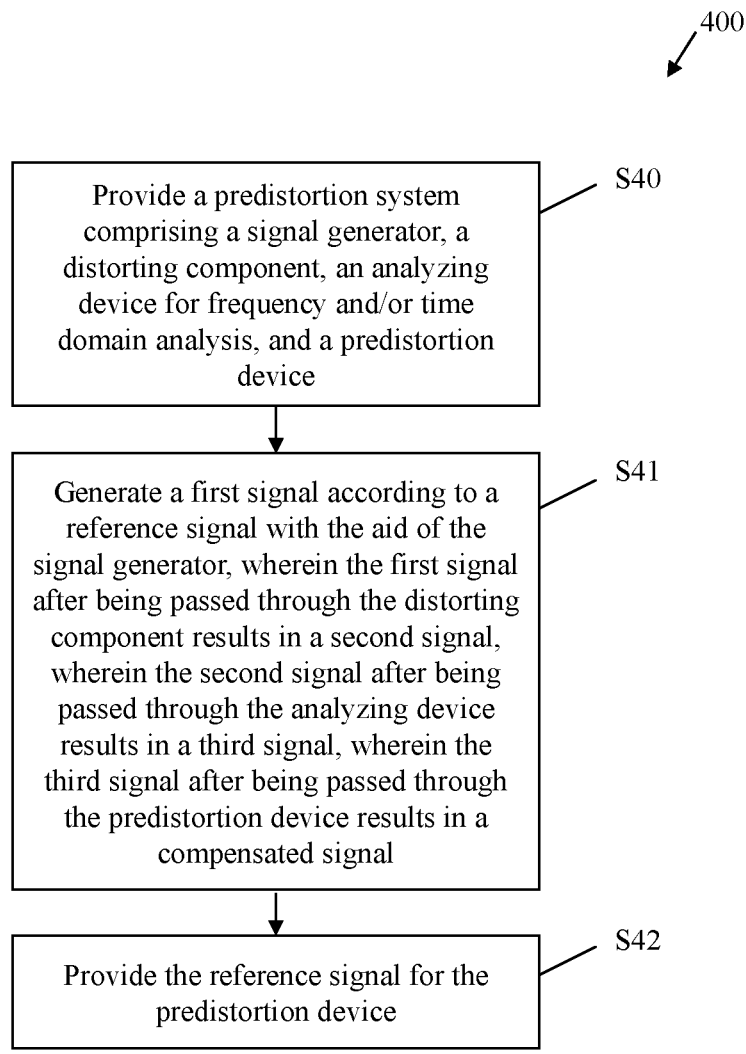
FIG. 6 shows a flow chart of an exemplary predistortion method.

FIG. 6 shows a flow chart 400 of an exemplary predistortion method. In a first step S40, a predistortion system comprising a signal generator, a distorting component, an analyzing device for frequency and/or time domain analysis, and a predistortion device is provided. In a second step S41, a first signal according to a reference signal is generated with the aid of the signal generator, wherein the first signal after being passed through the distorting component results in a second signal, wherein the second signal after being passed through the analyzing device results in a third signal, wherein the third signal after being passed through the predistortion device results in a compensated signal. Then, in a third step S42, the reference signal is provided for the predistortion device.

Figure 7:
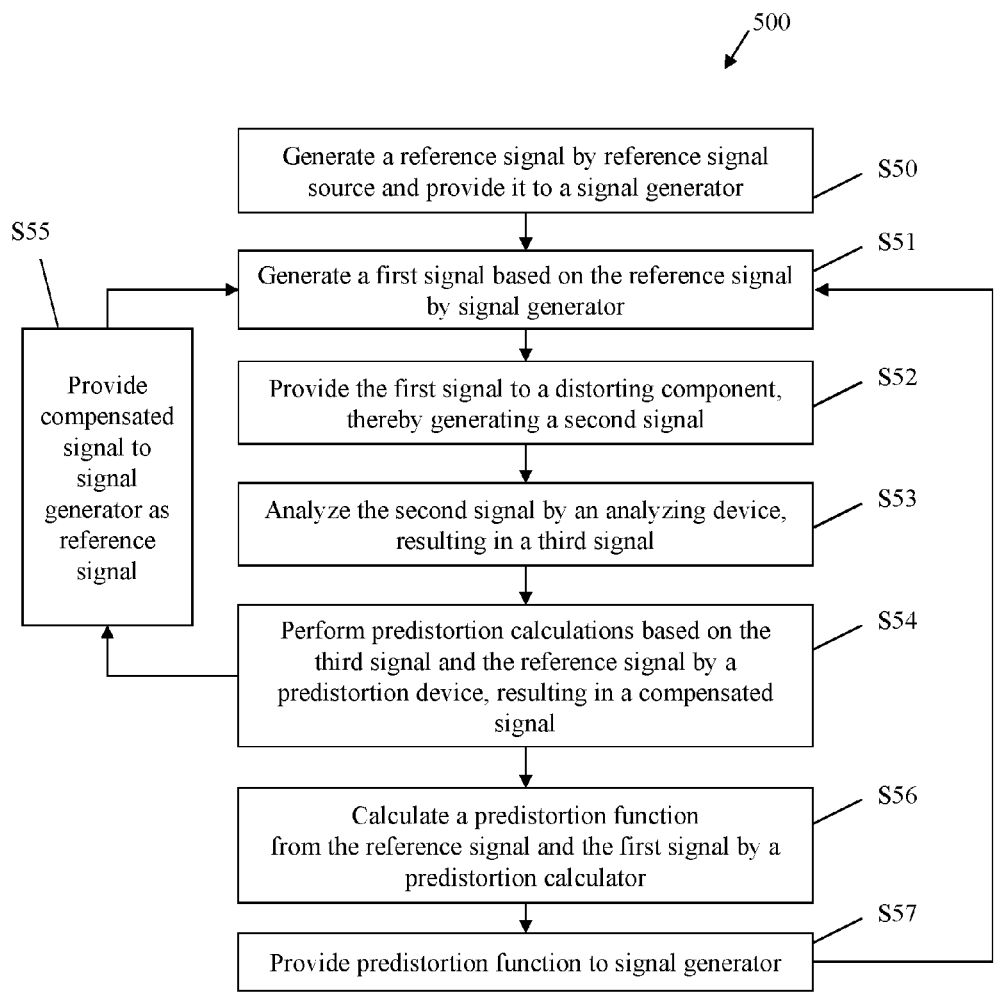
FIG. 7 shows a flow chart of an embodiment of the second aspect of the invention.

In FIG. 7, a flow chart 500 of an embodiment of the predistortion method according to the second aspect of the invention is shown. The method comprises a first step S50, in which a reference signal is generated by a reference signal source and provided to a signal generator. In a second step S51, a first signal is generated based upon the reference signal generator by the signal generator. In a third step S52, the first signal is provided to a distorting component, which therefrom generates a second signal. In a fourth step S53, the second signal is analyzed by an analyzing device, resulting in a third signal. In a fifth step S54, predistortion calculations are performed based on the third signal and the reference signal by a predistortion device, resulting in a compensated signal. In a sixth step S55, this compensated signal is provided to the signal generator, which uses it as reference signal as of now. A number of iterations of the steps S51-S55 are performed. This number of iterations can be pre-specified, but also can be adaptively set based upon for example the change of the compensated signal through the iterations. For example, once the change of the compensated signal from one iteration to the next iteration is below a certain threshold, the iterative process is stopped.

Moreover, in a seventh step S56, a predistortion function is calculated from the reference signal and the first signal by a predistortion calculator. This though is only done after the iterative process has been finished. This means that the reference signal and the final first signal are used for determining the predistortion function. Regarding how to calculate the predistortion function, it is referred to the earlier elaborations regarding FIG. 2. In a final eighth step S57, the predistortion function is provided to the signal generator, which from there on can use the predistortion function for generating the first signal. The iterative process is then no longer needed.

The embodiments of the present invention can be implemented by hardware, software, or any combination thereof. Various embodiments of the present invention may be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, or the like.

Various embodiments of the present invention may also be implemented in the form of software modules, processes, functions, or the like which perform the features or operations described above. Software code can be stored in a memory unit so that it can be executed by a processor. The memory unit may be located inside or outside the processor and can communicate date with the processor through a variety of known means.

The invention is not limited to the examples and especially not to an amplifier as distorting component. Also mixers or any other distorting component can be predistorted by use of the invention. The characteristics of the exemplary embodiments can be used in any advantageous combination.

While various embodiments of the present invention have been described above, it should be understood that they have been presented by way of example only, and not limitation. Numerous changes to the disclosed embodiments can be made in accordance with the disclosure herein without departing from the spirit or scope of the invention should not be limited by any of the above-described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A predistortion system for correcting a distortion of a distorting component, comprising:
   a signal generator, adapted to generate a first signal based upon a reference signal,
   the distorting component, adapted to generate a second signal, based upon the first signal, and an iterative predistortion device, adapted to determine a compensated signal based upon the second signal and the reference signal, wherein the signal generator is adapted to use the compensated signal as reference signal in further iterations after a first iteration, wherein the predistortion system moreover comprises a predistortion calculation device, adapted to determine a predistortion function based upon the reference signal and the first signal, and wherein the signal generator is adapted to generate the first signal based upon the predistortion function for further reference signals.

2. The predistortion system of claim 1, wherein the iterative predistortion device comprises:
- an analyzing device, adapted to perform a frequency and/or time domain analysis of the second signal, resulting in a third signal, and
- a predistortion device, adapted to generate the compensated signal based upon the reference signal and the third signal, and wherein the predistortion device is adapted to determine the compensated signal iteratively.

3. The predistortion system of claim 1, wherein the predistortion calculation device is adapted to determine the predistortion function as a transformation for transforming the reference signal into the first signal.

4. The predistortion system of claim 3, wherein the predistortion calculation device is adapted to determine the transformation as a polynomial transformation function or a memory polynomial transformation function or a volterra transformation function.

5. The predistortion system of claim 4, wherein the predistortion calculation device is adapted to determine optimal parameters of the transformation function used.

6. The predistortion system of claim 3, wherein the predistortion calculation device is adapted to use a user input transformation function and/or transformation function parameters for determining the predistortion function.

7. The predistortion system of claim 1, wherein the distorting component is an amplifier.

8. The predistortion system of claim 1, wherein the predistortion calculating device is adapted to
- determine, which coefficients of a predistortion filter contribute significantly to generating an ideally predistorted first signal, and
- to disregard coefficients not significantly contributing to generating an ideally predistorted first signal.

9. A predistortion method for correcting a distortion of a distorting component, comprising:
- generating a first signal based upon a reference signal, by a signal generator,
- generating a second signal from the first signal, by a distorting component,
- determining a compensated signal based upon the second signal and the reference signal, by an iterative predistortion device,
- using the compensated signal as reference signal in further iterations after a first iteration, by the signal generator,
- determining a predistortion function based upon the reference signal and the first signal, by a predistortion calculation device, and
- generating the first signal based upon the predistortion function for further reference signals, by the signal generator.

10. The predistortion method of claim 9, wherein the iterative predistortion method comprises:
- a performing a frequency and/or time domain analysis of the second signal, resulting in a third signal,
- generating the compensated signal based upon the reference signal and the third signal, and wherein the compensated signal is determined iteratively.

11. The predistortion method of claim 9, wherein the predistortion function is determined as a transformation for transforming the reference signal into the first signal, by the predistortion calculation device.

12. The predistortion method of claim 11, wherein transformation is determined as a polynomial transformation function or a memory polynomial transformation function or a volterra transformation function, by the predistortion calculation device.

13. The predistortion method of claim 12, wherein optimal parameters of the transformation function used, are determined by the predistortion calculation device.

14. The predistortion method of claim 11, wherein a user input transformation function and/or transformation function parameters are used by the predistortion calculation device for determining the predistortion function.

15. The predistortion method of claim 9, wherein the method comprises
- determining, which coefficients of a predistortion filter contribute significantly to generating an ideally predistorted first signal, and
- disregarding coefficients not significantly contributing to generating an ideally predistorted first signal by the predistortion calculating device.

* * * * *